(12) United States Patent
Jones et al.

(10) Patent No.: US 11,177,824 B2
(45) Date of Patent: Nov. 16, 2021

(54) DICTIONARY EMBEDDED EXPANSION PROCEDURE

(71) Applicant: International Business Machines Corporation, Armonk, NY (US)

(72) Inventors: Jeremy B. Jones, San Jose, CA (US); Oliver Draese, Los Gatos, CA (US); Robert Tokumaru, Milpitas, CA (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 16/041,991

(22) Filed: Jul. 23, 2018

(65) Prior Publication Data

US 2020/0028520 A1 Jan. 23, 2020

(51) Int. Cl.
*G06F 16/21* (2019.01)
*G06F 16/23* (2019.01)
*H03M 7/30* (2006.01)
*H03M 7/40* (2006.01)

(52) U.S. Cl.
CPC ........ *H03M 7/3088* (2013.01); *G06F 16/212* (2019.01); *G06F 16/2365* (2019.01); *H03M 7/40* (2013.01)

(58) Field of Classification Search
None
See application file for complete search history.

(56) References Cited

U.S. PATENT DOCUMENTS

| 8,902,087 | B1 | 12/2014 | Kozin et al. |
| 2009/0198716 | A1* | 8/2009 | Howarth ............. H03M 7/3088 |
| 2012/0296983 | A1 | 11/2012 | Boehm |
| 2016/0006456 | A1 | 1/2016 | Muramatsu et al. |
| 2016/0224520 | A1* | 8/2016 | Kataoka ................ G06F 40/126 |
| 2018/0101553 | A1* | 4/2018 | Nakamura .......... G06F 16/2228 |

OTHER PUBLICATIONS

Mell, Peter et al.; "The NIST Definition of Cloud Computing;" National Institute of Standards and Technology; Special Publication 800-145; Sep. 2011; 7 pages.

* cited by examiner

*Primary Examiner* — Dawaune A Conyers
(74) *Attorney, Agent, or Firm* — Schmeiser, Olsen & Watts, LLP; Stephanie Carusillo (57) ABSTRACT

A system and method for creating a self-describing dictionary for expanding compressed data objects stored in a database of a database management system includes creating a dictionary associated with a data object that is customized to the data object, generating a custom expansion procedure for expanding the data object that is tailored to the dictionary, at a same time as creating the dictionary, and embedding the custom expansion procedure into the dictionary.

17 Claims, 8 Drawing Sheets

DICTIONARY EMBEDDED EXPANSION PROCEDURE

TECHNICAL FIELD

The present invention relates to systems and methods for creating a dictionary embedded expansion procedure, and more specifically the embodiments of a data compression expansion system for creating a self-describing dictionary for expanding compressed data objects stored in a database of a database management system.

BACKGROUND

Variable length compressed data is computationally intensive to expand and requires specific information about a dictionary associated with a compressed data object, such as the encoding and format. In addition, to expand variable length compressed data, the custom compression algorithm must be known. Often, the custom compression algorithm is changed or enhanced over time, which means a generic compression algorithm used by outside sources accessing the data must also be changed each time the custom algorithm changes.

SUMMARY

An embodiment of the present invention relates to a method, and associated computer system and computer program product for creating a self-describing dictionary for expanding compressed data objects stored in a database of a database management system. A processor of a computing system creates a dictionary associated with a data object that is customized to the data object. A custom expansion procedure for expanding the data object that is tailored to the dictionary is generated at a same time as creating the dictionary. The custom expansion procedure is embedded into the dictionary.

DETAILED DESCRIPTION

Databases use data compression to save on disk storage and reduce I/O. One of the biggest bottlenecks in database operations is accessing the disk storage. When data is compressed, there is a lot more processing that has to happen to expand and compress data, which is still much faster than having to wait on I/O to locate uncompressed data on disks. Thus, current databases almost always use data compression. Often times, database administrators use outside took to process data, so the outside tools need to either have the database access the data, expand the data, and export the data, or the outside tools need an external utility that has access to the same expansion and compression algorithm. Database technology now employs variable length encoding, which is compression with a dictionary that translates common character strings into a shorter code, such as a fixed length code (e.g. 12-bit code in a 4K sized dictionary). For example, the fixed length code is compared with a dictionary to determine that a specific fixed length code represents a specific set of symbols, which can be used to expand that value. Variable length encoding allows a shorter length code to be applied to higher frequency sets of string values. If a string value is very common in a given set of data, instead of assigning the given set of data a 12-bit code, the given set of data can be assigned a 4-bit code or a 3-bit code, for example. If a string value is rarely used in a given set of data, the given set of data can be assigned a 16-bit code or a 15-bit code, for example.

Entropy encoding or Huffman compression is a technique used to employ the variable length encoding, without using a prefix or requiring an indicator to tell a reader of a bit stream the length of every code to interpret. However, variable length compressed data is difficult and CPU intensive to expand. In a given bit stream, a length of the bit stream is known, but not the length of the first code that needs to be read, or the next code that needs to be read, or the code after that, etc. In other words, a database management system does not know how far to read before reaching the targeted variable length code. In a fixed length dictionary, it is much less computationally intensive because the database management system can take 12-bits or 10-bits, for example, and read those bits and then look up those bits in a dictionary for translation. With variable length encoding, a certain amount of statistics on how the encoding was established is needed. In some cases, an entropy descriptor can be used to determine how the encoding was established, which describes the number of codes that use a certain length. For example, if there is a maximum length of 16-bits allowed, a variable length code can be as short as 1-bit and as long as 16 bits. The entropy descriptor can determine that there are, for example, ten codes that are the length of 3 bits and 3,000 codes that are 8-bit lengths. Additionally, complicated and computationally intensive software is needed to expand the variable length compressed data. Software applications do not typically read bit-by-bit, but rather read byte-by-byte, at a minimum. Thus, software has to quickly calculate the length of the code to be interpreted by performing complex mathematical calculations. Once the length is determined, the software can isolate the amount of bits needed to interpret and expand the variable length compressed data. Using software to perform these steps is more expensive than hardware. Hardware solutions have the advantage of being able to simultaneously do calculations on the same bit stream to determine the result. Accordingly, while variable length compression increases compression ratios and provides other advantages, using software to expand the compressed data is very computationally intensive and expensive to operate.

Because data needs to be accessed by an external entity, such as a third party tool, from outside of the database, either the database has to process the data or the external utility needs to process the data. As a result, there are needs/requirements external to the database that need to be satisfied. One requirement is the need to develop a software for expansion in the event that a customer moved data that was compressed using variable length encoding (e.g. Huffman compression) on a mainframe to a replication site which is typically older hardware than the mainframe that performed the variable length encoding. For example, newer hardware is used in test environments and production environments, and older hardware is used for backup. When the data is moved to an older machine that does not have the hardware capable of interpreting variable length encoded dictionaries, there is a need to provide a software expansion so that the data is still accessible by the older hardware.

If a compression algorithm used in a data source, such as a database management system (DBMS), is changed or enhanced, an independent generic expansion function used outside of the data source needs to be adjusted to retain access to the compressed data. For example, if there is a custom expansion algorithm, and there is a need to send the data to an external entity outside of the DBMS, then the DBMS has to use the custom expansion algorithm to expand the data for the external entity, or the external entity needs to have the custom expansion algorithm to expand the data. A generic expansion is currently used to allow external entities to expand the data, but using a generic expansion algorithm has performance penalties because the generic expansion algorithm has to cope with all possible lengths of the variable length codes, independent of the variable length codes' existence or distribution within a specific dictionary. Existing DBMS compression is kept as simple as possible to keep the performance penalties as low as possible (e.g. classic fixed length dictionaries). Because data often needs to leave the DBMS in an uncompressed state to be accessible by third party tools (i.e. external entity outside of the DBMS), expensive export procedures must be used, as well as generic expansion algorithms.

Accordingly, embodiments of the present invention provide a custom software expansion so that the data (e.g. database object that was compressed using Huffman compression accessible by the older hardware when the data is moved to an older machine that does not have the hardware capable of interpreting variable length encoded dictionaries. For example, embodiments of the present invention provide a custom software expansion procedure that is custom built for use with a specific dictionary, avoiding the need to use generic expansion procedures. One advantage of a custom software expansion procedure tailored to a specific dictionary is that the custom software expansion procedure has a performance edge over a generic expansion procedure, and is designed to be used only with a specific dictionary. The custom software expansion procedure is an executable, such as machine executable code, that exists within the dictionary. For example, the custom software expansion procedure is generated machine code that is addressed similar to any computer readable code, and can be called by third party tools. As a result, third party tools used to access and expand compressed data can use the custom software expansion procedure. If the third party tool knows that the compressed data is on an older hardware, the third party tool can directly call the custom software procedure that is located directly in the dictionary.

Embodiments of the present invention provide a dictionary-specific machine code that is generated at a dictionary creation time, which forms part of the dictionary. For instance, when the dictionary is created, the machine code for the custom software expansion procedure is also created, and travels with the dictionary as the dictionary travels with the data. So when the data gets transferred to an older machine or external entity (e.g. third party tool/vendor) outside of the DBMS, the external entity can analyze the dictionary, read that the dictionary is a variable length encoded dictionary (e.g. Huffman encoded dictionary) from a header of the dictionary, and determine that the current hardware is incapable of expanding the data. With the database management system described herein, the external entity only has to call an address that exists with the dictionary, wherein the address is an executable (e.g. machine code pertaining to the custom software expansion) that can be used to automatically start expanding the data.

The custom software expansion procedure, which is machine executable code, is located inside the dictionary. Located inside the dictionary means that the code for the custom software expansion is located alongside or with the dictionary. The dictionary includes the expansion dictionary, the compression dictionary, and the header. The dictionary travels with the data, and so part of that dictionary has machine code that is embedded along with the dictionary, and the machine code representing the custom software expansion procedure uses the dictionary to expand the data.

Figure 1:
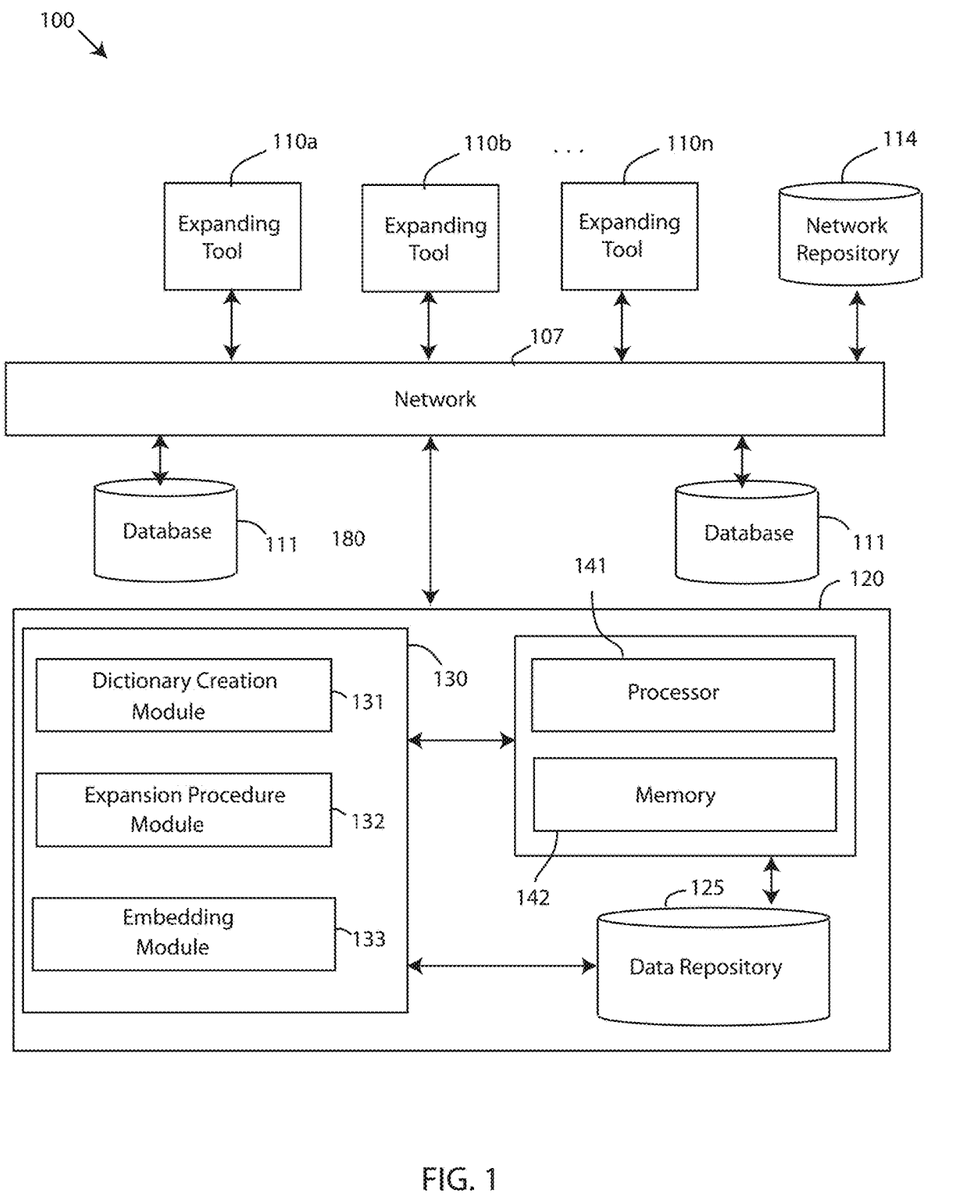
FIG. 1 depicts a block diagram of a data compression expansion system, in accordance with embodiments of the present invention.

Referring now to the drawings, FIG. 1 depicts a block diagram of data compression expansion system 100, in accordance with embodiments of the present invention. The data compression expansion system 100 is a computing system that controls the storage, compression, retrieval, and updating of data objects stored on database 111. The data compression expansion system 100 may be useful for third party tools vendors operating an expanding tool needing to expand compressed data stored on a database associated with hardware that is incapable of expanding compressed data objects compressed (e.g. data objects compressed with variable length compression. For example, the data compression expansion system 100 may embed a custom expansion algorithm/procedure that is tailored to a dictionary associated with the compressed data object, so that an expanding tool can read the compressed data even if the hardware associated therewith cannot expand the data object. In other words, the data compression expansion system 100 allows an adjustment of the compression algorithm without breaking a compatibility with expanding tools because a dictionary-specific, custom expansion procedure is able to handle the adjustment. Further, the data compression expansion system 100 generates the custom expansion procedure that is specific to the dictionary to optimize performance of the data expansion because the custom expansion procedure is tailored towards the specific dictionary and the code length of the compressed data object associated with the specific dictionary.

Embodiments of the data compression expansion system 100 may be a database management system, a data object expansion system, a custom software expansion creation system, and the like. In an exemplary embodiment, the data compression expansion system 100 includes a computing system 120. The computing system 120 may be a computer system, a computer, a server, one or more servers, a backend computing system, and the like, for controlling the storage, compression, retrieval, and updating of data objects stored on database 111. In an exemplary embodiment, the computing system 120 is a database management system.

Furthermore, the data compression expansion system 100 includes one or more expanding tools 110a, 110b . . . 110n (a single expanding tool is referred to hereinafter as expanding tool 110) and one or more database 111 (a single database is referred to hereinafter as database 111) that are communicatively coupled to the computing system 120 over a network 107. For instance, information/data may be transmitted to and/or received from the expanding tool 110 and database 111 over a network 107. In one embodiment, the network 107 is the cloud. Further embodiments of network 107 may refer to a group of two or more computer systems linked together. Network 107 may be any type of computer network known by individuals skilled in the art. Examples of network 107 include a LAN, WAN, campus area networks (CAN), home area networks (HAN), metropolitan area networks (MAN), an enterprise network, cloud computing network (either physical or virtual) e.g. the Internet, a cellular communication network such as GSM or CDMA network or a mobile communications data network. In another embodiment, the architecture of the network 107 is a peer-to-peer network, wherein in another embodiment, the network 107 may be organized as a client/server architecture.

In one example, the network 107 further comprises, in addition to the computing system 120, a connection to one or more network-accessible knowledge bases 114, which are network repositories containing information of the sender/recipient, product information, catalogs, location information, user activity, user preferences, network repositories or other systems connected to the network 107 that are considered nodes of the network 107. In an embodiment where the computing system 120 or network repositories allocate resources to be used by the other nodes of the network 107, the computing system 120 and network-accessible knowledge bases 114 may be referred to as servers.

The network-accessible knowledge bases 114 may be a data collection area on the network 107 which may back up and save all the data transmitted back and forth between the nodes of the network 107. For example, the network repository may be a data center saving and cataloging call requests, bit lengths, data object locations, addresses, and the like, to generate both historical and predictive reports regarding a function of the data compression expansion system 100. In one embodiment, a data collection center housing the network-accessible knowledge bases 114 includes an analytic module capable of analyzing each piece of data being stored by the network-accessible knowledge bases 114. Further, the computing system 120 may be integrated with or as a part of the data collection center housing the network-accessible knowledge bases 114. In some alternative embodiments, the network-accessible knowledge bases 114 may be a local repository that is connected to the computing system 120.

The expanding tool 110 is a tool, program, engine, software, etc. that is configured to access data objects from database 111 by interfacing with the computing system 120. In one embodiment, the expanding tool is a third party tool vendor that is configured to access and read compressed data objects by expanding the compressed data object. The expanding tool 110.

Referring still to FIG. 1, the data compression expansion system 100 also includes one or more databases 111. The database 111 is storage device configured to store compressed data objects and dictionaries associated with the data objects. The database 111 can be accessed by the computing system 120 over a network for retrieving compressed data objects and an accompanying dictionary. The data objects stored by the database 111 are represented by tables or partitions of tables compressed by a compression algorithm. In an exemplary embodiment, the data objects stored on the database 111 are compressed using variable length compression, such as entropy encoding or Huffman compression. Each data object that is compressed and stored on the database includes a dictionary for translating a specific length code to a specific set of symbols, which can be used to expand the compressed data object.

Furthermore, the computing system 120 of the data compression expansion system 100 is equipped with a memory device 142 which stores various data/information/code, and a processor 141 for implementing the tasks associated with the data compression expansion system 100. An expansion procedure application 130 is loaded in the memory device 142 of the computing system 120. The expansion procedure application 130 can be an interface, an application, a program, a module, or a combination of modules. In an exemplary embodiment, the expansion procedure application 130 may be a software application running on one or more back end servers servicing the database management system.

The expansion procedure application 130 of the computing system 120 includes a dictionary creation module 131, an expansion procedure module 132, and an embedding module 133. A "module" may refer to a hardware-based module, software-based module or a module may be a combination of hardware and software. The hardware-based modules may include self-contained components such as chipsets, specialized circuitry and one or more memory devices, while a software-based module may be part of a program code or linked to the program code containing specific programmed instructions, which may be loaded in the memory device of the computing system 120. A module (whether hardware, software, or a combination thereof) may be designed to implement or execute one or more particular functions or routines.

The dictionary creation module 131 includes one or more components of hardware and/or software program code for creating a dictionary associated with a data object that is compressed by the database management system using variable length compression, and that is customized to the data object. For instance, the dictionary creation module 131 creates a single dictionary per table or per partition if it is a multi-partition table space, so that each table or partition has an associated dictionary, wherein the dictionary is stored in the database 111 with the table or partition. The dictionary is used to read the data object that has been compressed and stored in database 111. Further, the dictionary created by the dictionary creation module 131 is custom and specific to the data object, such as a data table (i.e. a customized dictionary). As an example, a first data table that has a first data (e.g. name and an address) will result in the data being provided in a first set of columns, and another data table having a second data (e.g. a social security number) will result in the data being provided in a different set of columns, and the dictionaries created for both tables will be different. The dictionary travels with the data object if the data object is moved to another hardware storage location.

The computing system 120 also includes an expansion procedure module 132. The expansion procedure module 132 includes one or more components of hardware and/or software program code for generating a custom software expansion procedure for expanding the compressed data object that is tailored to the dictionary, at a same time as creating the self-describing dictionary. For instance, the expansion procedure module 132 generates, creates, writes, etc. a custom expansion procedure that is specific to the dictionary stored along with a specific database object in the database 111. The custom expansion procedure allows for expanding the compressed database object without having code specific to the database management system 120 (e.g. DB2 code). For example, expanding tool 110, which is external to the database management system 120, is provided access to the data objects on stored on the database 111 so that the expanding tool 110 can expand the compressed data object and run reports, view the data, and the like. Conventional methods require that a database management expand the compressed data for the external expanding tools, or the expanding tool use the expanding tool's own algorithm. If the expanding tool uses its own expanding algorithm, then the expanding tool needs to know what type of dictionary is associated with the targeted data object. However, the custom expansion procedure generated by the expansion procedure module 132 eliminates the need to constantly update the dictionaries so that the outside expanding tool 110 knows what type of dictionary is currently associated with the data object, because the dictionary is self-describing and/or self-executable. An example of a custom expansion procedure is one that does not waste time on checking for impossible codes. One instance of when such a custom procedure might be created is when a dictionary is created for variable length compression, and by chance, every generated code is either 3 bits, or 15 bits. With that guarantee, an expansion procedure can be created that only needs to check if the code is a possible 3 bit code. If not, then it can be assumed to be a 15 bit code, and no time is wasted on checking other code lengths.

Figure 2:
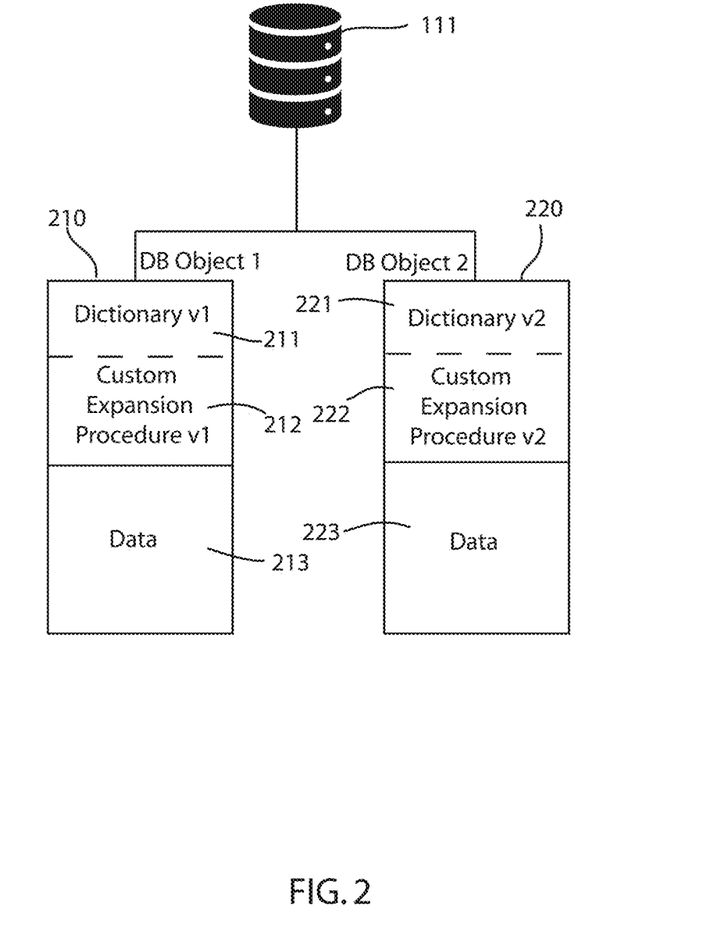
FIG. 2 depicts a schematic diagram of two database objects stored in a database, in accordance with embodiments of the present invention.

FIG. 2 depicts a schematic diagram of two database objects stored in a database 111, in accordance with embodiments of the present invention. Located within database 111 is a first data object 210 and a second data object 220. Data objects 210 and 220 may be a database object, such as a data table or a partition of a data table. Data object 210 includes a dictionary 211, labeled as "dictionary v1," a custom expansion procedure 212, labeled as "custom expansion procedure v1," and data 213, which includes the data and the metadata of the data object. Data object 220 includes a dictionary 221, labeled as "dictionary v2," a custom expansion procedure 222, labeled as "custom expansion procedure v2," and data 223, which includes the data and the metadata of the data Object. As shown in FIG. 2, data objects 210, 220 are different data objects, and each have a version of a dictionary that is different and customized to the data object. Likewise, each data object 210, 220 has a custom expansion procedure 212, 222 embedded into the dictionaries 211, 221, respectively. The custom expansion procedure 212 embedded in dictionary 211 is custom built for the dictionary 211, and the custom expansion procedure 222 embedded in dictionary 221 is custom built for the dictionary 221.

The computing system 120 includes an embedding module 133. The embedding module 132 includes one or more components of hardware and/or software program code for embedding the custom expansion procedure into the dictionary. The custom expansion procedure forms a part of the dictionary, as shown schematically in FIG. 2. For instance, the embedding module 132 embeds or other includes the custom expansion procedure into the dictionary, in response to the custom expansion procedure being created.

Figure 3:
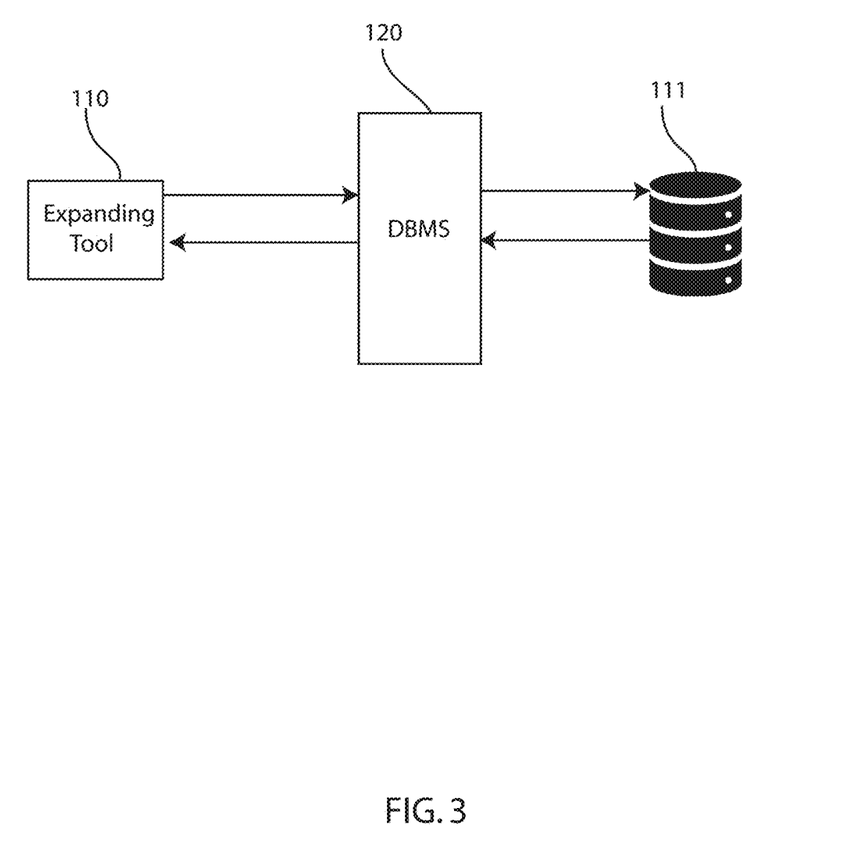
FIG. 3 depicts a schematic view of an expanding tool interfacing with the database management system to access a data object from the database, in accordance with embodiments of the present invention.

FIG. 3 depicts a schematic view of an expanding tool interfacing with the database management system 120 to access a data object from the database 111, in accordance with embodiments of the present invention. When an expanding tool 110 external to the database management system 120 loads dictionary from the database management system 120 and calls the embedded custom expansion procedure of the dictionary, the embedded custom expansion procedure is automatically run by the expanding tool 110 for expanding the compressed data object. For instance, the expanding tool, such as a third party tool vendor, can get access to the compressed data objects (e.g. data object 210, 220) by loading the dictionary, and then calling the embedded custom expansion procedure, passing in pointers to the compressed data and an output buffer without requiring any skills specific to the compression or expansion technology. In other words, due to the embedded custom expansion procedure being machine executable code having an address, the expanding tool can call the embedded custom expansion procedure to start the expanding process without beforehand needing to know the custom algorithm that would be needed to expand the compressed data object.

Various tasks and specific functions of the modules of the computing system 120 may be performed by additional modules, or may be combined into other module(s) to reduce the number of modules. Further, embodiments of the computer or computer system 120 may comprise specialized, non-generic hardware and circuitry (i.e., specialized discrete non-generic analog, digital, and logic-based circuitry) (independently or in combination) particularized for executing only methods of the present invention. The specialized discrete non-generic analog, digital, and logic-based circuitry may include proprietary specially designed components (e.g., a specialized integrated circuit, such as for example an Application Specific Integrated Circuit (ASIC), designed for only implementing methods of the present invention).

Moreover, embodiment of the data compression expansion system 100 improves database technology by altering the hardware, such as a database, by embedding executable code in a dictionary stored in the database, which allows various third-party tools to expand data regardless of the technical capabilities of the database or hardware storing the compressed data. Without embedding the dictionary with custom expansion procedure as machine readable code, various third-party tools would be required to know the custom algorithm to expand compressed data for each dictionary, which then requires database management systems to update the dictionaries to include the custom algorithm for each dictionary. Embodiments of the data compression expansion system 100 provides a technical solution to the above-drawbacks by eliminating the computationally intensive need to update all dictionaries with custom algorithms so that third-party expanding tools can automatically expand the compressed data for each data object selected. Further, by embedding the custom expansion procedure in the dictionary that is specific to the dictionary, the custom expansion procedure can be simplified based on the bit-length of the codes of the compressed data associated with the dictionary. The technical solution(s) described herein is necessarily rooted in computer technology in order to overcome a problem specifically arising in the database technology and data expansion technology.

Figure 4:
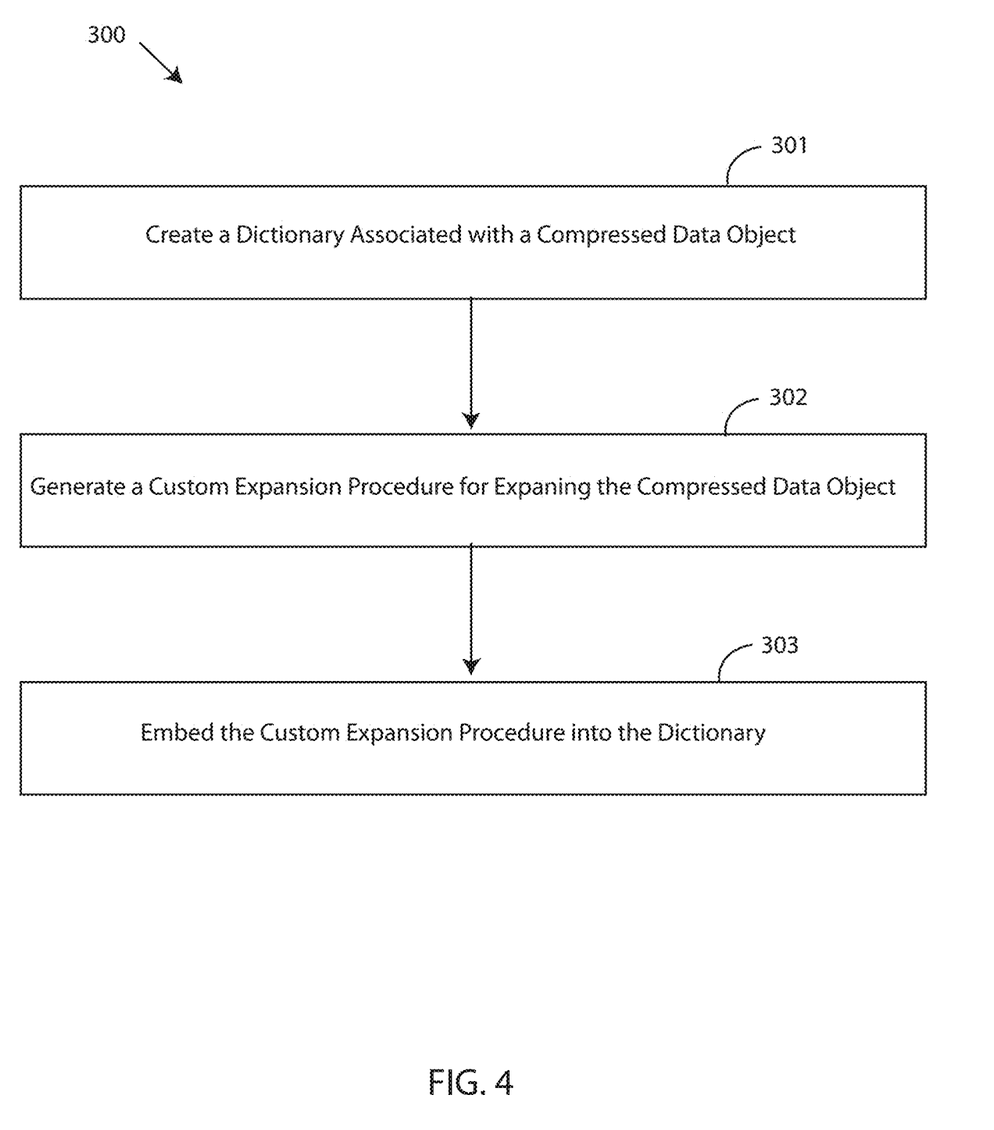
FIG. 4 depicts a flow chart of a method for creating a self-describing dictionary for expanding compressed data objects stored in a database of a database management system, in accordance with embodiments of the present invention.

Referring now to FIG. 4, which depicts a flow chart of a method 300 for creating a self-describing dictionary for expanding compressed data objects stored in a database of a database management system, in accordance with embodiments of the present invention. One embodiment of a method 300 or algorithm that may be implemented for creating a self-describing dictionary for expanding compressed data objects stored in a database of a database management system with the data compression expansion system 100 described in FIGS. 1-3 using one or more computer systems as defined generically in FIG. 6 below, and more specifically by the specific embodiments of FIG. 1.

Embodiments of the method 300 for creating a self-describing dictionary for expanding compressed data objects stored in a database of a database management system, in accordance with embodiments of the present invention, may begin at step 301 wherein a dictionary associated with a compressed data object is created. The dictionary is custom built to the compressed data object. Step 302 generates a custom expansion procedure for expanding the custom data object. Step 303 embeds the custom expansion procedure into the dictionary.

Figure 5:
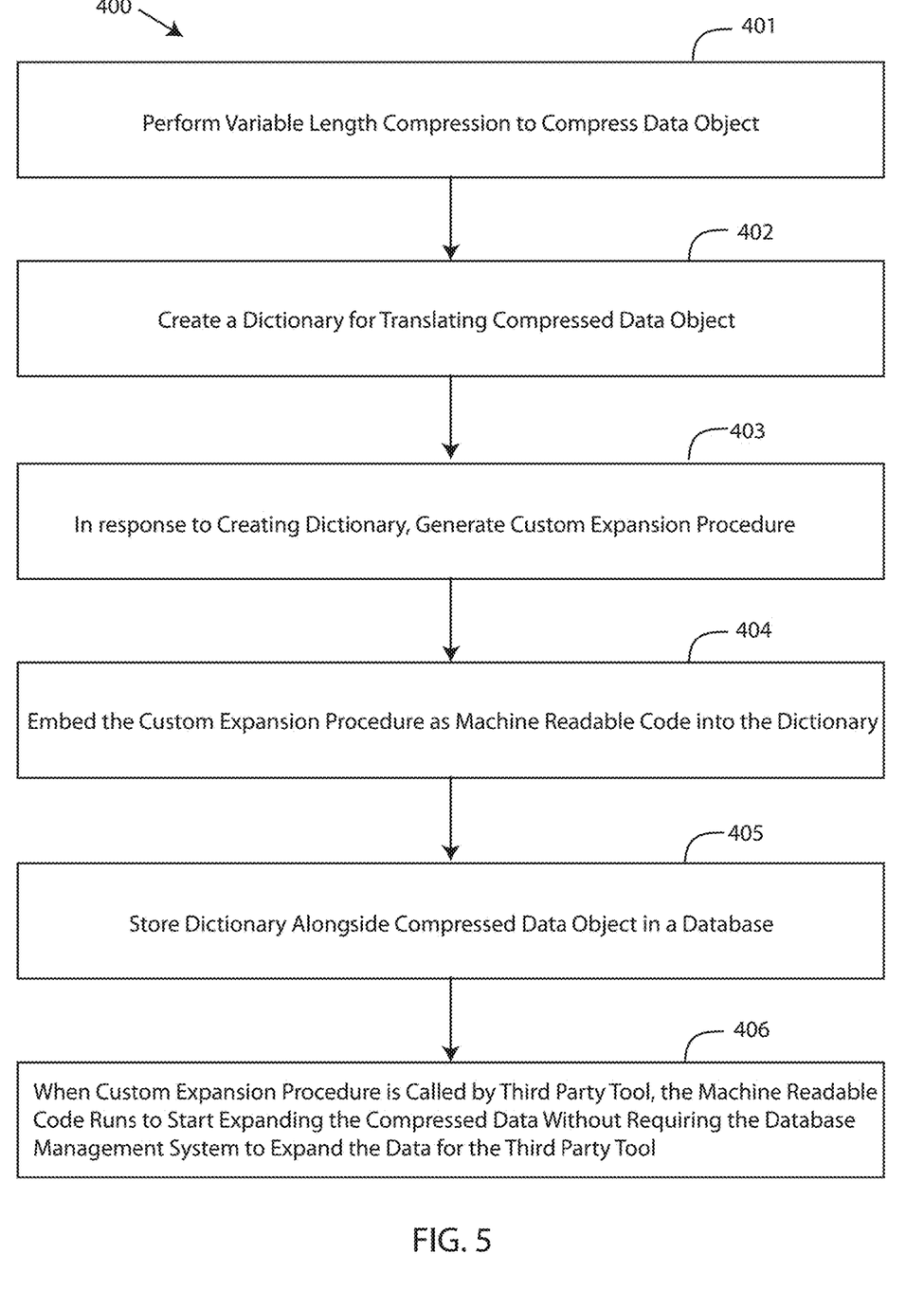
FIG. 5 depicts a detailed flow chart of a method for creating a self-describing dictionary for expanding compressed data objects stored in a database of a database management system, in accordance with embodiments of the present invention.

FIG. 5 depicts a detailed flow chart of a method 400 for creating a self-describing dictionary for expanding compressed data objects stored in a database of a database management system, in accordance with embodiments of the present invention. Step 401 performs variable length compression to compress a data object. Step 402 creates a dictionary for translating the compressed data object. Step 403 generates a custom expansion procedure for expanding the compressed data, in response to the creation of the dictionary. For example, at the time of creation of a dictionary, the custom expansion procedure is generated. Step 404 embeds the custom expansion procedure as machine readable code into the dictionary. Step 405 stores the dictionary alongside the compressed data object in a database. At step 406, when an expanding tool external to the database management system loads the dictionary from the database management system and calls the embedded custom expansion procedure, the embedded custom procedure is automatically run by the expanding tool for expanding the compressed data object.

Figure 6:
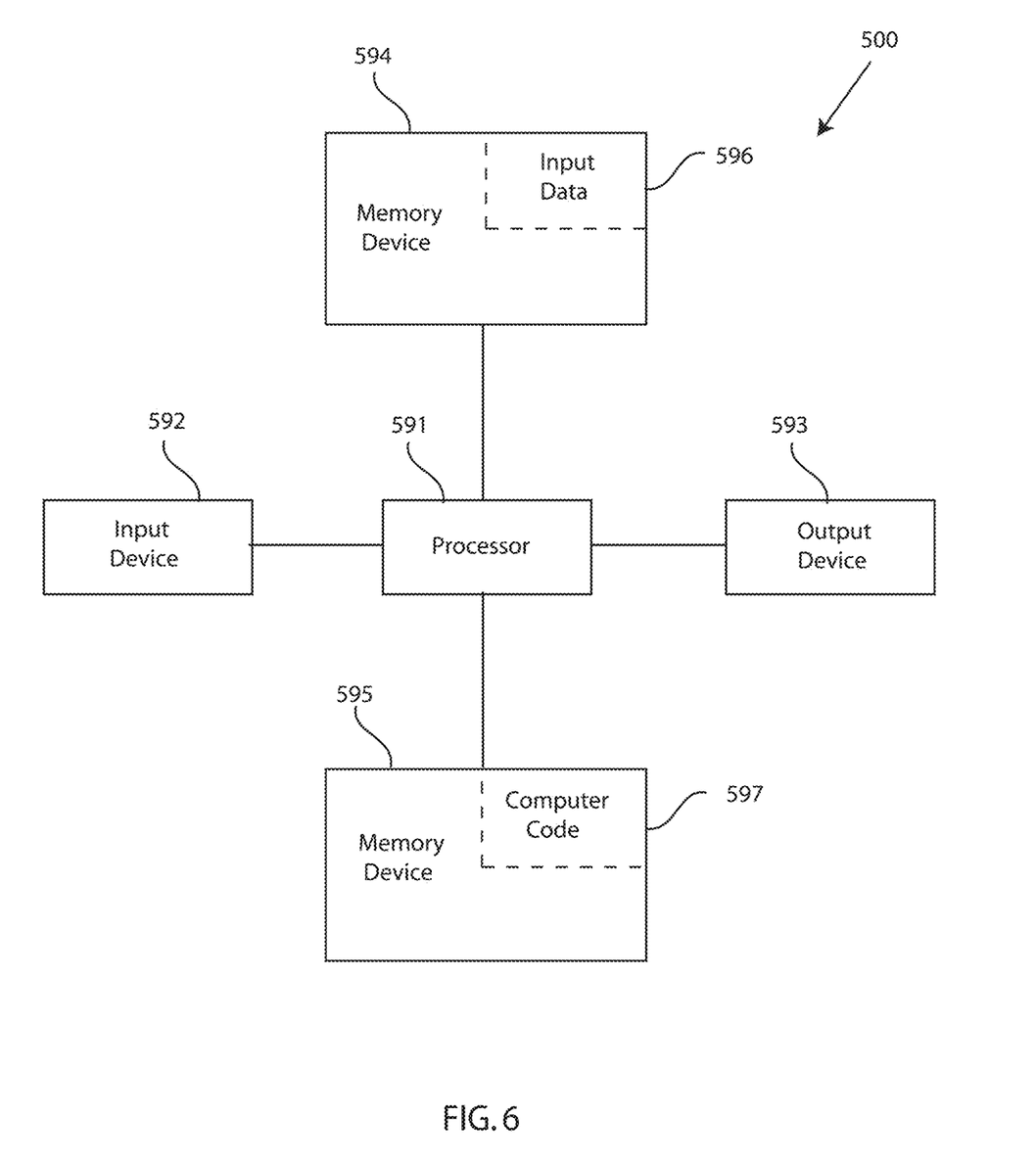
FIG. 6 depicts a block diagram of a computer system for the database management system of FIGS. 1-3, capable of implementing methods for creating a self-describing dictionary for expanding compressed data objects stored in a database of a database management system of FIGS. 4-5, in accordance with embodiments of the present invention.

FIG. 6 depicts a block diagram of a computer system for the data compression expansion system 100 of FIGS. 1-3, capable of implementing methods for creating a self-describing dictionary for expanding compressed data objects stored in a database of a database management system of FIGS. 4-5, in accordance with embodiments of the present invention. The computer system 500 may generally comprise a processor 591, an input device 592 coupled to the processor 591, an output device 593 coupled to the processor 591, and memory devices 594 and 595 each coupled to the processor 591. The input device 592, output device 593 and memory devices 594, 595 may each be coupled to the processor 591 via a bus. Processor 591 may perform computations and control the functions of computer system 500, including executing instructions included in the computer code 597 for the tools and programs capable of implementing a method for creating a self-describing dictionary for expanding compressed data objects stored in a database of a database management system in the manner prescribed by the embodiments of FIGS. 4-5 using the data compression expansion system 100 of FIGS. 1-3, wherein the instructions of the computer code 597 may be executed by processor 591 via memory device 595. The computer code 597 may include software or program instructions that may implement one or more algorithms for implementing the method for creating a self-describing dictionary for expanding compressed data objects stored in a database of a database management system, as described in detail above. The processor 591 executes the computer code 597. Processor 591 may include a single processing unit, or may be distributed across one or more processing units in one or more locations (e.g., on a client and server).

The memory device 594 may include input data 596. The input data 596 includes any inputs required by the computer code 597. The output device 593 displays output from the computer code 597. Either or both memory devices 594 and 595 may be used as a computer usable storage medium (or program storage device) having a computer-readable program embodied therein and/or having other data stored therein, wherein the computer-readable program comprises the computer code 597. Generally, a computer program product (or, alternatively, an article of manufacture) of the computer system 500 may comprise said computer usable storage medium (or said program storage device).

Memory devices 594, 595 include any known computer-readable storage medium, including those described in detail below. In one embodiment, cache memory elements of memory devices 594, 595 may provide temporary storage of at least some program code (e.g., computer code 597) in order to reduce the number of times code must be retrieved from bulk storage while instructions of the computer code 597 are executed. Moreover, similar to processor 591, memory devices 594, 595 may reside at a single physical location, including one or more types of data storage, or be distributed across a plurality of physical systems in various forms. Further, memory devices 594, 595 can include data distributed across, for example, a local area network (LAN) or a wide area network (WAN), Further, memory devices 594, 595 may include an operating system (not shown) and may include other systems not shown in FIG. 6.

In some embodiments, the computer system may further be coupled to an input/output (I/O) interface and a computer data storage unit. An I/O interface may include any system for exchanging information to or from an input device 592 or output device 593. The input device 592 may be, inter alia, a keyboard, a mouse, etc. or in some embodiments the touchscreen of a computing device. The output device 593 may be, inter alia, a printer, a plotter, a display device (such as a computer screen), a magnetic tape, a removable hard disk, a floppy disk, etc. The memory devices 594 and 595 may be, inter alia, a hard disk, a floppy disk, a magnetic tape, an optical storage such as a compact disc (CD) or a digital video disc (DVD), a dynamic random access memory (DRAM), a read-only memory (ROM), etc. The bus may provide a communication link between each of the components in computer 500, and may include any type of transmission link, including electrical, optical, wireless, etc.

An I/O interface may allow computer system 500 to store information (e.g., data or program instructions such as program code 597) on and retrieve the information from computer data storage unit (not shown). Computer data storage unit includes a known computer-readable storage medium, which is described below. In one embodiment, computer data storage unit may be a non-volatile data storage device, such as a magnetic disk drive (i.e., hard disk drive) or an optical disc drive (e.g., a CD-ROM drive which receives a CD-ROM disk). In other embodiments, the data storage unit may include a knowledge base or data repository 125 as shown in FIG. 1.

As will be appreciated by one skilled in the art, in a first embodiment, the present invention may be a method; in a second embodiment, the present invention may be a system; and in a third embodiment, the present invention may be a computer program product. Any of the components of the embodiments of the present invention can be deployed, managed, serviced, etc. by a service provider that offers to deploy or integrate computing infrastructure with respect to database systems and methods. Thus, an embodiment of the present invention discloses a process for supporting computer infrastructure, where the process includes providing at least one support service for at least one of integrating, hosting, maintaining and deploying computer-readable code (e.g., program code 597) in a computer system (e.g., computer system 500) including one or more processor(s) 591, wherein the processor(s) carry out instructions contained in the computer code 597 causing the computer system to create a self-describing dictionary for expanding compressed data objects stored in a database of a database management system. Another embodiment discloses a process for supporting computer infrastructure, where the process includes integrating computer-readable program code into a computer system 500 including a processor.

The step of integrating includes storing the program code in a computer-readable storage device of the computer system 500 through use of the processor. The program code, upon being executed by the processor, implements a method for creating a self-describing dictionary for expanding compressed data objects stored in a database of a database management system. Thus, the present invention discloses a process for supporting, deploying and/or integrating computer infrastructure, integrating, hosting, maintaining, and deploying computer-readable code into the computer system 500, wherein the code in combination with the computer system 500 is capable of performing a method for creating a self-describing dictionary for expanding compressed data objects stored in a database of a database management system.

A computer program product, of the present invention comprises one or more computer-readable hardware storage devices having computer-readable program code stored therein, said program code containing instructions executable by one or more processors of a computer system to implement the methods of the present invention.

A computer system of the present invention comprises one or more processors, one or more memories, and one or more computer-readable hardware storage devices, said one or more hardware storage devices containing program code executable by the one or more processors via the one or more memories to implement the methods of the present invention.

The present invention may be a system, a method, and/or a computer program product at any possible technical detail level of integration. The computer program product may include a computer-readable storage medium (or media) having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine-dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 7:
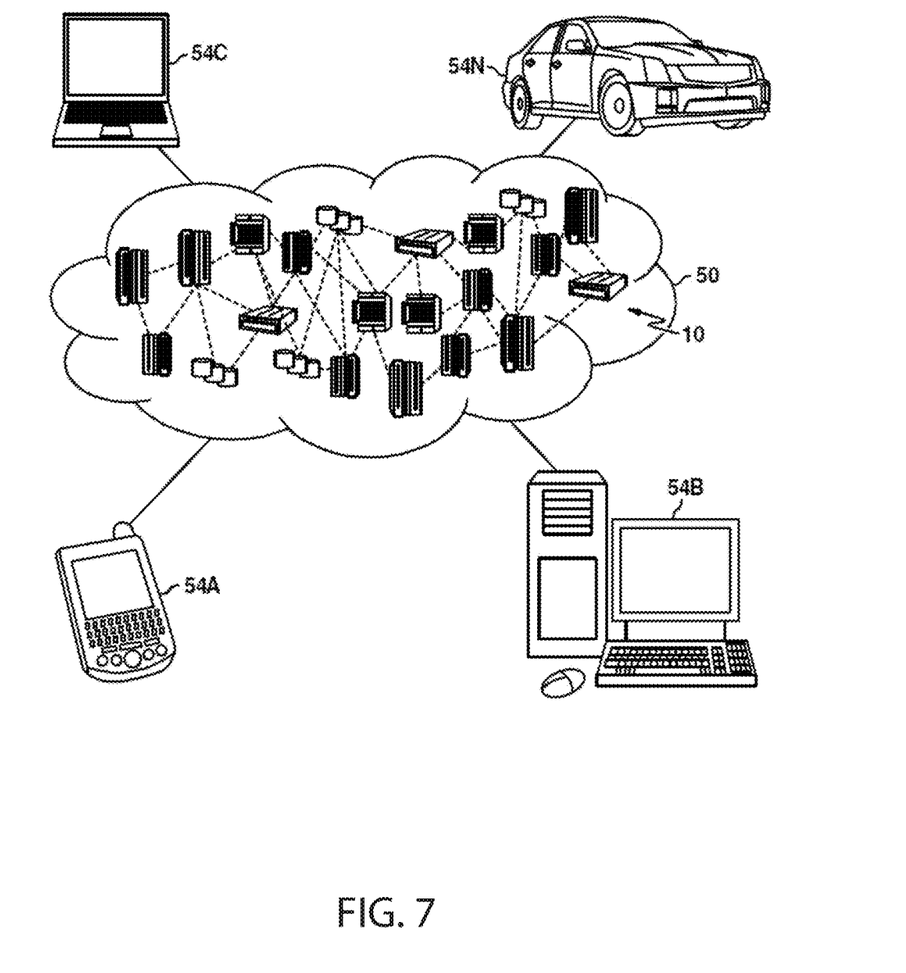
FIG. 7 depicts a cloud computing environment, in accordance with embodiments of the present invention.

Referring now to FIG. 7, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate, Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A, 54B, 54C and 54N shown in FIG. 7 are intended to be illustrative only and that computing nodes 10 and cloud computing environment 50 can communicate with any type of computerized device over any type of network and/or network addressable connection (e.g., using a web browser).

Figure 8:
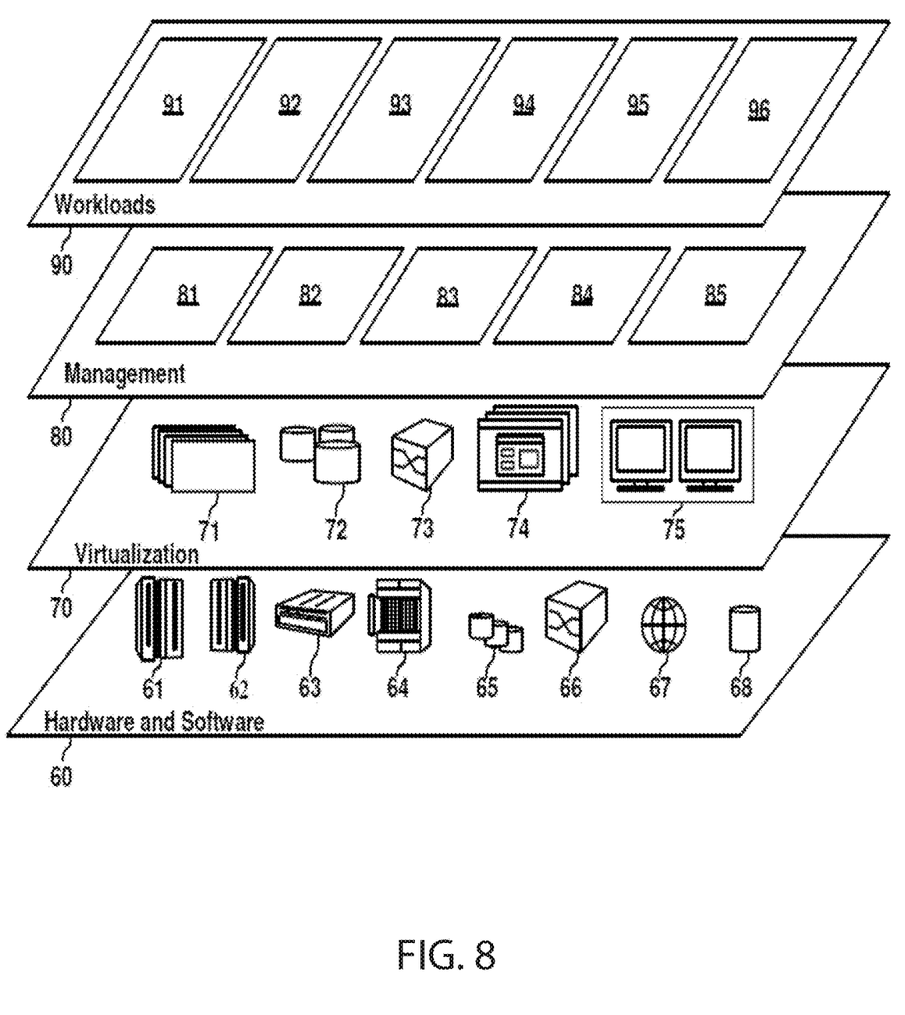
FIG. 8 depicts abstraction model layers, in accordance with embodiments of the present invention.

Referring now to FIG. 8, a set of functional abstraction layers provided by cloud computing environment 50 (see FIG. 7) are shown. It should be understood in advance that the components, layers, and functions shown in FIG. 8 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provides pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and GUI and data compression expansion 96.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for creating a self-describing dictionary for expanding compressed data objects stored in a database of a database management system, the method comprising:
    creating, by a processor of the database management system, a dictionary for translating a compressed data object that is customized to the compressed data, in response to the data object being compressed;
    generating, by the processor, a custom expansion procedure for expanding the data object that is tailored to the dictionary, at a same time as creating the dictionary; and
    embedding, by the processor, the custom expansion procedure into the dictionary;
    wherein, as a result of the custom expansion procedure being tailored to the dictionary, the custom expansion procedure does not need to able to handle n-bit codes if the dictionary does not include any codes of a n-bit length.

2. The method of claim 1, wherein, when an expanding tool external to the database management system loads the dictionary from the database management system and calls the embedded custom expansion procedure, the embedded custom expansion procedure is automatically run by the expanding tool for expanding the compressed data object.

3. The method of claim 1, wherein the custom expansion procedure is machine readable code that is configured to be called by an expanding tool.

4. The method of claim 1, wherein the dictionary includes a header, an expansion dictionary, a compression dictionary, and the custom expansion procedure.

5. The method of claim 1, further comprising storing, by the processor, the dictionary with the embedded custom expansion procedure alongside the data object in the database.

6. The method of claim 5, wherein the dictionary travels with the data object when the data object is moved to a new hardware location.

7. A database management system, comprising:
    a processor;
    a memory device coupled to the processor; and
    a computer readable storage device coupled to the processor, wherein the storage device contains program code executable by the processor via the memory device to implement a method for creating a self-describing dictionary for expanding compressed data objects stored in a database of the database management system, the method comprising:

creating, by a processor of the database management system, a dictionary for translating a compressed data object that is customized to the compressed data, in response to the data object being compressed;

generating, by the processor, a custom expansion procedure for expanding the data object that is tailored to the dictionary, at a same time as creating the dictionary; and embedding, by the processor, the custom expansion procedure into the dictionary;

wherein, as a result of the custom expansion procedure being tailored to the dictionary, the custom expansion procedure does not need to able to handle n-bit codes if the dictionary does not include any codes of a n-bit length.

8. The database management system of claim 7, wherein, when an expanding tool external to the database management system loads the dictionary from the database management system and calls the embedded custom expansion procedure, the embedded custom procedure is automatically run by the expanding tool for expanding the compressed data object.

9. The database management system of claim 7, wherein the custom expansion procedure is machine readable code that is configured to be called by an expanding tool.

10. The database management system of claim 7, wherein the dictionary includes a header, an expansion dictionary, a compression dictionary, and the custom expansion procedure.

11. The database management system of claim 7, further comprising storing, by the processor, the dictionary with the embedded custom expansion procedure alongside the data object in the database.

12. The database management system of claim 11, wherein the dictionary travels with the data object when the data object is moved to a new hardware location.

13. A computer program product, comprising a computer readable hardware storage device storing a computer readable program code, the computer readable program code comprising an algorithm that when executed by a processor of a database management system implements a method for creating a self-describing dictionary for expanding compressed data objects stored in a database of the database management system, the method comprising:

creating, by a processor of the database management system, a dictionary for translating a compressed data object that is customized to the compressed data, in response to the data object being compressed;

generating, by the processor, a custom expansion procedure for expanding the data object that is tailored to the dictionary, at a same time as creating the dictionary; and embedding, by the processor, the custom expansion procedure into the dictionary;

wherein, as a result of the custom expansion procedure being tailored to the dictionary, the custom expansion procedure does not need to able to handle n-bit codes if the dictionary does not include any codes of a n-bit length.

14. The computer program product of claim 13, wherein, when an expanding tool external to the database management system loads the dictionary from the database management system and calls the embedded custom expansion procedure, the embedded custom procedure is automatically run by the expanding tool for expanding the compressed data object.

15. The computer program product of claim 13, wherein the custom expansion procedure is machine readable code that is configured to be called by an expanding tool.

16. The computer program product of claim 13, wherein the dictionary includes a header, an expansion dictionary, a compression dictionary, and the custom expansion procedure.

17. The computer program product of claim 13, further comprising storing, by the processor, the dictionary with the embedded custom expansion procedure alongside the data object in the database, wherein the dictionary travels with the data object when the data object is moved to a new hardware location.

* * * * *